United States Patent
Kozuru et al.

(10) Patent No.: US 12,148,865 B2
(45) Date of Patent: Nov. 19, 2024

(54) LIGHT EMITTING DEVICE

(71) Applicant: NICHIA CORPORATION, Anan (JP)

(72) Inventors: Kazuma Kozuru, Tokushima (JP); Kiyoshi Enomoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/152,708

(22) Filed: Jan. 10, 2023

(65) Prior Publication Data

US 2023/0163250 A1 May 25, 2023

Related U.S. Application Data

(63) Continuation of application No. 17/162,913, filed on Jan. 29, 2021, now Pat. No. 11,581,458, which is a
(Continued)

(30) Foreign Application Priority Data

Jun. 5, 2018 (JP) .................................. 2018-107569

(51) Int. Cl.
*H01L 33/48* (2010.01)
*H01L 23/00* (2006.01)
(Continued)

(52) U.S. Cl.
CPC ............ *H01L 33/486* (2013.01); *H01L 24/08* (2013.01); *H01L 24/48* (2013.01); *H01L 33/38* (2013.01);
(Continued)

(58) Field of Classification Search
CPC ....... H01L 33/486; H01L 24/08; H01L 24/48; H01L 33/38; H01L 33/54; H01L 33/62;
(Continued)

(56) References Cited

U.S. PATENT DOCUMENTS

| 5,327,443 A | 7/1994 | Tanaka et al. |
| 7,521,863 B2 | 4/2009 | Tanda |

(Continued)

FOREIGN PATENT DOCUMENTS

| CN | 1874014 A | 12/2006 |
| JP | H3-214112 A | 9/1991 |

(Continued)

OTHER PUBLICATIONS

Restriction Requirement in the related U.S. Appl. No. 16/428,959, dated Jun. 11, 2020.
(Continued)

*Primary Examiner* — Cuong B Nguyen
(74) *Attorney, Agent, or Firm* — Global IP Counselors, LLP

(57) ABSTRACT

A light emitting device includes a first semiconductor laser element, a light reflecting member, a base member, and a wire. The base member includes a frame part forming a frame. The frame part has a step portion inside of the frame, a bonding surface bonded to the bottom part, a first inner surface extending below the bonding surface, a second inner surface extending above the bonding surface, a first planar surface defining a planar surface of the step portion on an upper surface side, and a first electrode layer and a second electrode layer electrically connected to each other. The second electrode layer is disposed on the first planar surface. The wire is bonded to the second electrode layer and electrically connected to the first semiconductor laser element. A width of the bonding surface is greater on a first planar surface side than on an opposite side.

18 Claims, 16 Drawing Sheets

Related U.S. Application Data continuation of application No. 16/428,959, filed on May 31, 2019, now Pat. No. 10,930,820.

(51) Int. Cl.
  *H01L 33/38* (2010.01)
  *H01L 33/54* (2010.01)
  *H01L 33/62* (2010.01)
  *H01L 33/64* (2010.01)

(52) U.S. Cl.
  CPC .............. *H01L 33/54* (2013.01); *H01L 33/62* (2013.01); *H01L 33/641* (2013.01); *H01L 33/642* (2013.01); *H01L 2224/48091* (2013.01); *H01L 2224/48227* (2013.01); *H01L 2924/15174* (2013.01)

(58) Field of Classification Search
  CPC .............. H01L 33/641; H01L 33/642; H01L 2224/48091; H01L 2224/48227; H01L 2924/15174; H01S 5/02253; H01S 5/4031; H01S 5/02255; H01S 5/02315; H01S 5/4093; H01S 5/02345; H01S 5/02476; H01S 5/02208; H01S 5/0425; H01S 5/023; H01S 5/0233; H01S 5/0235
  See application file for complete search history.

(56) References Cited

U.S. PATENT DOCUMENTS

| | | | |
|---|---|---|---|
| 8,754,423 | B2 | 6/2014 | Kim et al. |
| 2007/0007540 | A1 | 1/2007 | Hashimoto et al. |
| 2007/0164302 | A1 | 7/2007 | Tanda |
| 2007/0284714 | A1 | 12/2007 | Sakakibara et al. |
| 2008/0023721 | A1 | 1/2008 | Lee et al. |
| 2009/0101932 | A1 | 4/2009 | Chen |
| 2011/0158273 | A1* | 6/2011 | Okayama ............ H01S 5/02208 372/43.01 |
| 2012/0286319 | A1 | 11/2012 | Lee et al. |
| 2013/0214298 | A1 | 8/2013 | Lin et al. |
| 2014/0084182 | A1 | 3/2014 | Kim et al. |
| 2015/0319841 | A1 | 11/2015 | Kobayashi |
| 2017/0005248 | A1 | 1/2017 | Tomohiro |

FOREIGN PATENT DOCUMENTS

| | | |
|---|---|---|
| JP | H5-129711 A | 5/1993 |
| JP | 2005-12155 A | 1/2005 |
| JP | 2006-216764 A | 8/2006 |
| JP | 2007-214524 A | 8/2007 |
| JP | 2007-234846 A | 9/2007 |
| JP | 2008-172113 A | 7/2008 |
| JP | 2008-218678 A | 9/2008 |
| JP | 2008-543064 A | 11/2008 |
| JP | 2010045274 A | 2/2010 |
| JP | 2010-87181 A | 4/2010 |
| JP | 2014-068013 A | 4/2014 |
| JP | 2015-211196 A | 11/2015 |
| JP | 2016-184653 A | 10/2016 |
| KR | 2018-0053284 A | 5/2018 |

OTHER PUBLICATIONS

Ex Parte Quayle Action in the related U.S. Appl. No. 16/428,959, dated Sep. 1, 2020.

Notice of Allowance in the related U.S. Appl. No. 16/428,959, dated Oct. 21, 2020.

Non Final Office Action in the related U.S. Appl. No. 17/162,913, dated May 12, 2022.

* cited by examiner

LIGHT EMITTING DEVICE

CROSS REFERENCE TO RELATED APPLICATIONS

This application is a continuation application of U.S. patent application Ser. No. 17/162,913, filed on Jan. 29, 2021, which is a continuation application of U.S. patent application Ser. No. 16/428,959, filed on May 31, 2019, now U.S. Pat. No. 10,930,820. This application claims priority to Japanese Patent Application No. 2018-107569, filed on Jun. 5, 2018. The entire disclosures of U.S. patent application Ser. Nos. 17/162,913 and 16/428,959, and Japanese Patent Application No. 2018-107569 are hereby incorporated herein by reference.

BACKGROUND

1. Technical Field

The present disclosure relates to a light emitting device.

2. Description of Related Art

A light emitting element package including a base part, which includes a frame and an upward-facing surface, and a light emitting element such as a LED element or a semiconductor laser element on the upward-facing surface of the base part has been known. In addition, various materials can be employed for a base member serving as a package body, and examples of the materials include ceramics. JP 2014-68013 A describes a light emitting element package in which a light emitting element is disposed on a surface of a package body formed by a ceramic layer.

SUMMARY

On the other hand, because a light emitting element such as a semiconductor laser element generates heat, heat dissipation is required to be considered when manufacturing a light emitting element package. The light emitting element package described in JP 2014-68013 A has a structure in which a light emitting element is disposed on a ceramic, and has room for improvement with regards to heat dissipation.

A light emitting device according to certain embodiments of the present disclosure includes a first semiconductor laser element, a light reflecting member, a base member, and a wire. The first semiconductor laser element is configured to emit light. The light reflecting member is configured to reflect the light emitted from the first semiconductor laser element. The base member includes a bottom part having an arrangement surface, and a frame part bonded to the bottom part and forming a frame surrounding the arrangement surface. The frame part has an upper surface, a lower surface, a step portion inside of the frame, a bonding surface bonded to the bottom part, a first inner surface extending below the bonding surface, a second inner surface extending above the bonding surface, a first planar surface defining a planar surface of the step portion on an upper surface side, and a first electrode layer and a second electrode layer electrically connected to each other. The second electrode layer is disposed on the first planar surface of the frame part. The wire is bonded to the second electrode layer and electrically connected to the first semiconductor laser element. A width of the bonding surface on a first planar surface side is greater than a width of the bonding surface on an opposite side.

DETAILED DESCRIPTION OF EMBODIMENTS

Figure 1:
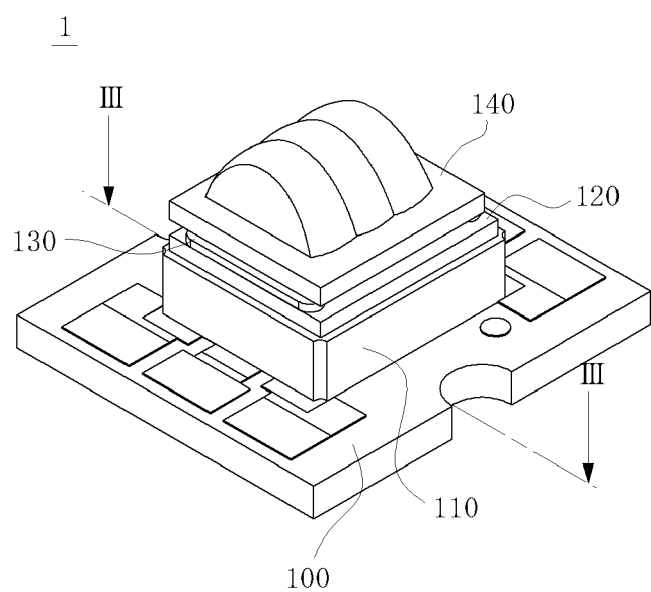
FIG. 1 is a schematic perspective view of a light emitting device according to a first embodiment.

Certain embodiments of the present invention will be described below with reference to the drawings. The embodiments shown below are intended to embody the technical idea of the present invention, and are not intended to limit the scope of the present invention. Further, in the descriptions below, the same names and reference numerals denote the same or similar members, and detailed descriptions thereof are omitted as appropriate. The sizes, positional relationships and the like of members shown in the drawings may be exaggerated for clarity of description.

First Embodiment

Figure 2:
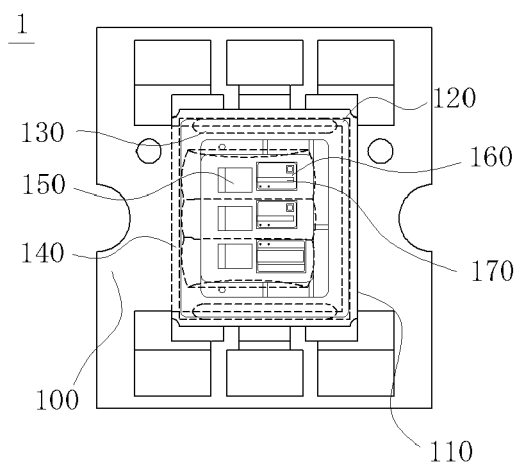
FIG. 2 is a schematic top view for illustrating an internal structure of the light emitting device according to the first embodiment.
Figure 3:
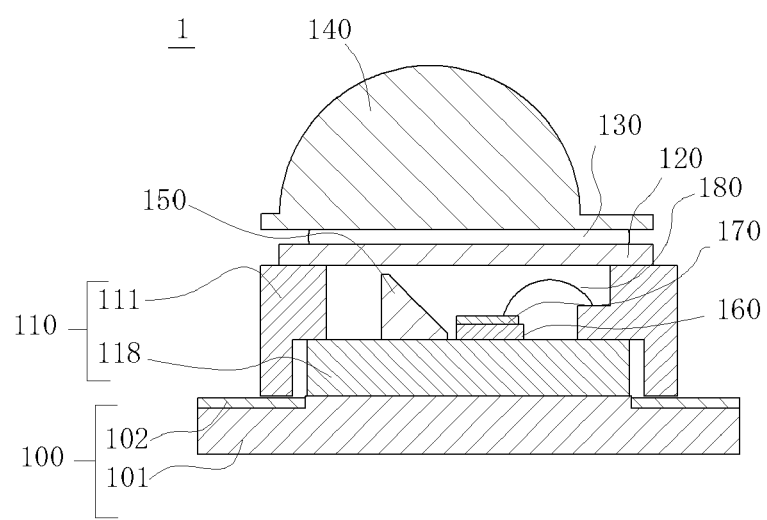
FIG. 3 is a schematic cross-sectional view of the light emitting device taken along a line III-III in FIG. 1.

FIG. 1 is a schematic view of a light emitting device 1 according to a first embodiment, FIG. 2 is a top view for illustrating an internal structure of a base member of the light emitting device, and FIG. 3 is a sectional view taken along on line III-III in FIG. 1. In FIG. 2, for showing the internal structure, a cover 120, an adhesion portion 130 and a lens member 140 are indicated by a broken line, and portions which are seen when viewed through the cover 120, the adhesion portion 130 and the lens member 140 are indicated with a solid line. In addition, for avoiding complication of the drawings, a wire 180 as shown in FIG. 3 is omitted in FIG. 2.

In the light emitting device 1, light radiated from a plurality of semiconductor laser elements 170 is reflected by a light reflecting surface of light reflecting members 150, and is emitted outside through the lens member 140. As shown in FIG. 2, three sub-mounts 160, on each of which at least one of the semiconductor laser elements 170 is disposed, are arranged, and the light reflecting members 150 are disposed each corresponding to at least one of the semiconductor laser elements 170. Each of the plurality of semiconductor laser elements 170 radiate light to a corresponding one of light reflecting members 150, and the corresponding light reflecting member 150 reflects light from the corresponding semiconductor laser element 170 toward the lens member 140. The light emitting device 1 includes a package configured to emit light, and a mounting substrate on which the package is mounted. Alternatively, a light emitting device without the mounting substrate may be considered as the light emitting device 1.

The light emitting device 1 includes a substrate 100 as the mounting substrate, and also includes a base member 110, the cover 120, the adhesion portion 130, the lens member 140, the light reflecting members 150, the sub-mounts 160, the semiconductor laser elements 170, and the wires 180, which are constituent elements included in the package. In addition, in a sealed space formed by bonding the base member 110 to the cover 120, the light reflecting members 150 and the sub-mounts 160 on each of which at least one of the semiconductor laser elements 170 is disposed are arranged. Further, the wires 180 for electrically connecting semiconductor laser elements 170 disposed on the base member 110 are provided. In addition, as shown in FIG. 3, the base member 110 includes a frame part 111 and a bottom part 118.

The substrate 100 is bonded to the frame part 111 and/or the bottom part 118. In addition, the frame part 111 is bonded to the cover 120 at a side opposite to a bonding surface bonded with the substrate 100. The cover 120 is bonded to the lens member 140 with an adhesive agent disposed therebetween. The adhesion portion 130 is formed by solidification of the adhesive agent. A gap is created between the cover 120 and the lens member 140 by forming the adhesion portion 130. Hereinafter, the light emitting device I will be described along with description of operations in manufacturing of the light emitting device 1.

FIGS. 4A to 10A are schematic views for illustrating operations until the light emitting device 1 is obtained. In addition, FIGS. 4B to 10B or 4C to 10C show schematic cross-sectional views in the steps so as to correspond to FIGS. 4A to 10A, respectively. FIGS. 4B to 10B are schematic cross-sectional views corresponding to line BI-BI shown in FIG. 4A. FIGS. 4C to 10C are schematic cross-sectional views corresponding to line BII to BII shown in FIG. 4A. Dotted lines S1 and S2 are not constituent elements of a light emitting element 2, but auxiliary lines for indicating correspondence in directions of the light emitting device 2 in the respective drawings. In addition, an auxiliary line in each cross-sectional view indicates a front side of the cross-sectional view, such that the auxiliary line in each cross-sectional view corresponds to a corresponding one of the auxiliary lines in the schematic view in a corresponding one of FIGS. 4A, 5A, 6A, 7A, 8A, 9A, and 10A. For example, the cross-sectional view of the base member 110 in FIG. 5B with a line S1 is taken along a line corresponding to a line BI-BI in FIG. 4A, where the front face in FIG. 5B is at the S1 line side of the base member 110 in FIG. 5A.

Figure 4A:
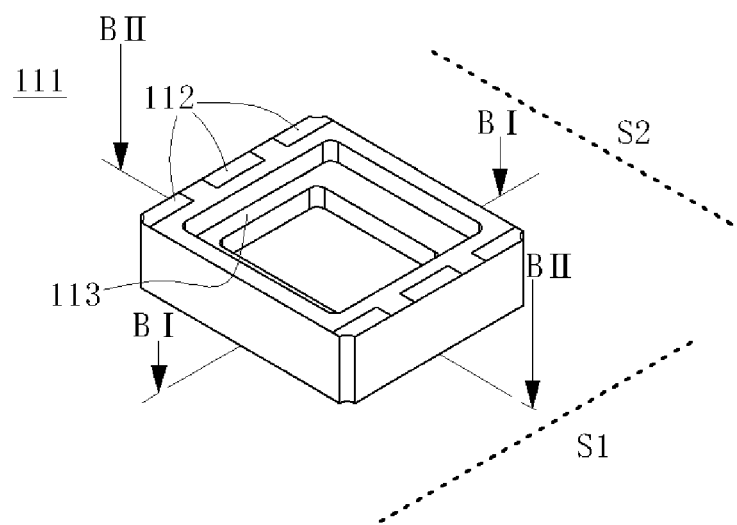
FIG. 4A is a schematic perspective view for illustrating a method of manufacturing the light emitting device according to the first embodiment.
Figure 4B:
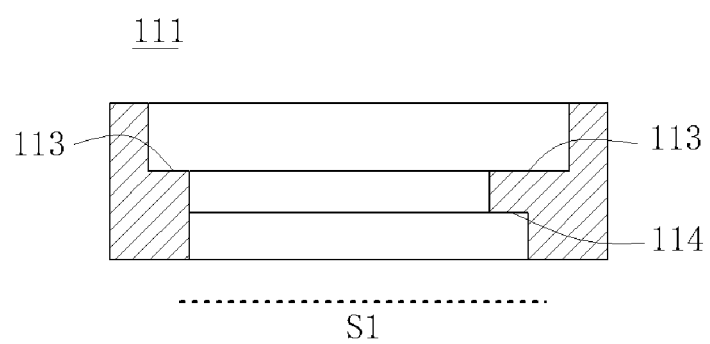
FIG. 4B is a schematic cross-sectional view taken along a line BI-BI in FIG. 4A for illustrating the method of manufacturing the light emitting device according to the first embodiment.
Figure 4C:
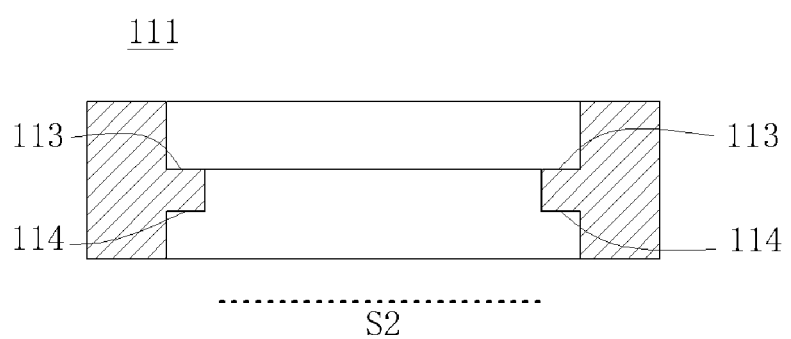
FIG. 4C is a sectional view taken along a line BII-BII in FIG. 4A for illustrating the method of manufacturing the light emitting device according to the first embodiment.
Figure 4D:
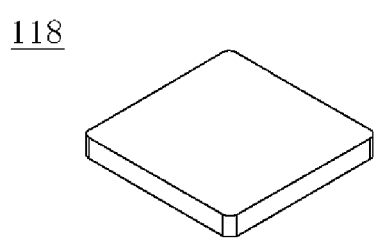
FIG. 4D is a schematic perspective view of a bottom part of the light emitting device according to the first embodiment.

As shown in FIGS. 4A and 4D, the frame part 111 and the bottom part 118 which form the base member 110 are provided. A metal such as Cu or Al can be used for the bottom part 118, and a ceramic such as alumina ($Al_2O_3$) or AlN can be used for the frame part 111. Any appropriate material may be used for the bottom part 118, but at least, the bottom part 118 has a heat dissipation higher than that of the frame part 111, and the bottom part 118 has a thermal conductivity higher than that of the frame part 111.

The bottom part 118 includes a bonding surface bonded to the substrate 100, and an arrangement surface on which the light reflecting member 150, the sub-mount 160 and the semiconductor laser element 170 are disposed. Each of the bonding surface and the arrangement surface has a rectangular shape. In addition, the thickness from the bonding surface to the arrangement surface is substantially uniform. In the present disclosure, a rectangular shape with modified corners such as rounded corners and/or slanted corners is also referred to as "a rectangular shape". Similarly, a polygonal shape with rounded corners or the like is also referred to as a "polygonal shape". In addition, when a corner of a rectangular shape or a polygonal shape is modified, the modified corner portion is considered to be included in a corresponding side of the rectangular shape or the polygonal shape. A surface bonded to the substrate 100 is considered as a bottom surface. The bonding surface of the bottom part 118 can be regarded as the bottom surface. The bottom surface and the arrangement surface may alternatively have any appropriate shapes other than the shapes described above.

The frame part 111 has a first electrode layer 112 at the bottom surface, which is a surface bonded to the substrate 100. The first electrode layer 112 includes, for example, a metal layer, and is bonded to a metal film 103 of the substrate 100. Electric power is supplied to the semiconductor laser element 170 through the metal film 103. In addition, the frame part 111 has a step portion inside the frame. The step portion included in the frame part 111 extends inward of the frame part 111, and a planar surface of the step portion at the bottom surface 118 side is a bonding surface 113 bonded to the bottom part 118. Thus, the planar surface intersecting the inner surface 116 form a step portion with the inner surface 116 on an inner side of the frame formed by the frame part 111. In the present specification, of two opposite planar surfaces, a planar surface closer to the substrate 100 is referred to as a "lower surface", and a planar surface opposite to the lower surface is referred to as an "upper surface", for the sake of convenience. Alternatively, a planar surface closer to the lens member 140 is referred to as an "upper surface", and the surface opposite to the upper surface is referred to as a "lower surface". In FIG. 4A, the frame part 111 is arranged such that the upper surface faces downward and the lower surface faces upward.

Figure 4E:
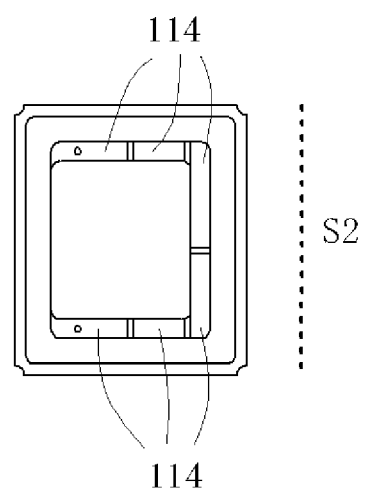
FIG. 4E is a schematic top view of a frame part of the light emitting device according to the first embodiment.
Figure 4F:
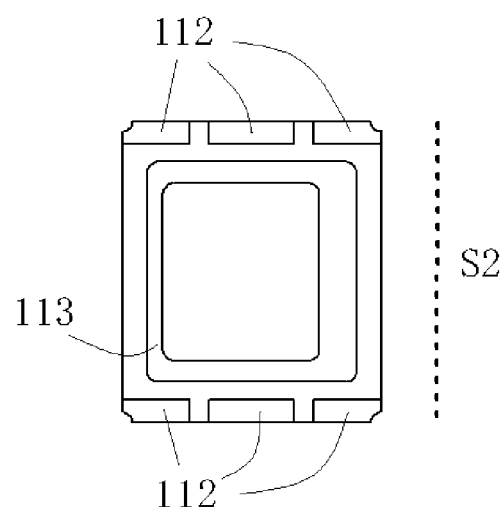
FIG. 4F is a schematic bottom view of the frame part of the light emitting device according to the first embodiment.

FIG. 4E is a top view of the frame part 111, and FIG. 4F is a bottom view of the frame part 111. The frame part 111 includes the bonding surface 113 at a planar surface of the step portion 111 that is seen in a bottom view (that is, the lower surface of the step portion 111). A second electrode layer 114 to be electrically connected to a semiconductor laser element 170 is disposed at the planar surface of the step portion that is seen in a top view (that is, the lower surface of the step portion 111). The planar surface intersects at least a part of the inner surface 117, and is different from the bonding surface 113. The second electrode layer 114 is electrically connected to the first electrode layer 112 through, for example, a via hole. The second electrode layer 114 includes, for example, a metal layer, and is arranged on a ceramic layer, and therefore is not exposed to the lower surface of the step portion. Further, in the bottom view, the step portion is disposed along all of the four sides of the frame part 111, but in the top view, the step portion is disposed along only three sides of the four sides of the frame part 111, and is not disposed along the other one side of the four sides except for end portions overlapping two sides at both ends. That is, the region having the step portion in the top view does not correspond to the region having the step portion in the bottom view. For bonding of the bonding surface 113 of the step portion to the bottom part 118, the step portion is disposed along the entire periphery of the frame part 111 in the bottom view. On the other hand, the planar surface of the step portion that is seen in the top view has a region sufficient for disposing the second electrode layer, and is not necessarily disposed along the entire periphery.

In addition, the bonding surface 113 has a width along a side opposite to a side not provided with the second electrode layer 114 larger than a width of the bonding surface 113 along each of other sides of the bonding surface 113. On the other hand, a surface of the frame part 111 bonded to the substrate 100 is designed such that a width along a side not provided with the second electrode layer 114 and a width along a side opposite thereto is the same. In other words, the shortest distance between a pair of opposite lateral surfaces of the frame part 111 meeting the surface of the frame part 111 bonded with the substrate 100 and the shortest distance between another pair of opposite lateral surfaces of the frame part 111 intersecting the surface of the frame part 111 bonded with the substrate 100 are the same at corresponding positions of each pair of opposite sides. The term "the same" as used herein refers to that a difference between two or more values to be compared is within a design tolerance. With such a structure, a force applied to the base member 110 at the time of bonding the frame to the substrate 100 by soldering can be balanced. The term "corresponding positions of each pair of opposite sides" as used herein refers to, with two sides opposite to and parallel to each other, a certain position in one of the two sides and a position in the other of the two sides with the shortest distance therebetween.

Figure 5A:
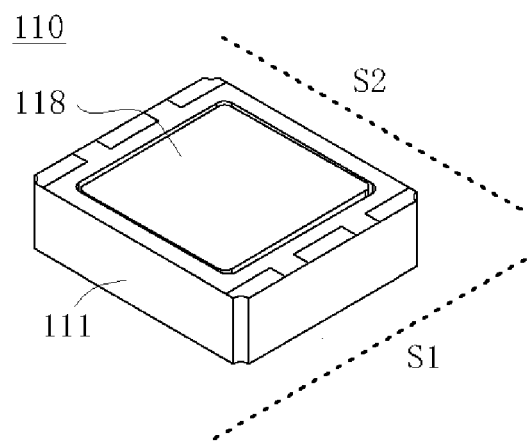
FIG. 5A is a schematic perspective view for illustrating the method of manufacturing the light emitting device according to the first embodiment.

Next, as shown in FIG. 5A, the bonding surface 113 of the frame part 111 is bonded to the bottom part 118. For the bonding, for example, a silver brazing material containing Ag as a main component and containing Cu can be used, and other metal brazing materials can also be used. As shown in FIG. 4A, silver brazing material is applied to the bonding surface of the frame part 111 while the bottom surface of the frame part 111 faces upward, and the bottom part 118 is placed inside the frame of the frame part 111 with the silver brazing material melted by heating. The silver brazing material is then cooled to bond the frame part 111 to the bottom part 118, so that the base member 110 is formed. The silver brazing material is applied to a bonding region between the frame part 111 and the bottom part 118, with the bonding region plated with Ni.

Figure 5B:
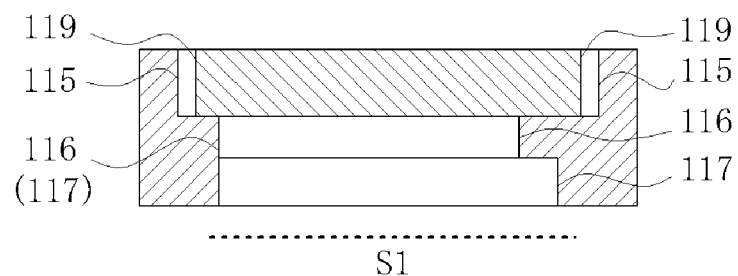
FIG. 5B is a schematic cross-sectional view taken along a line BI-BI in FIG. 4A for illustrating the method of manufacturing the light emitting device according to the first embodiment.
Figure 5C:
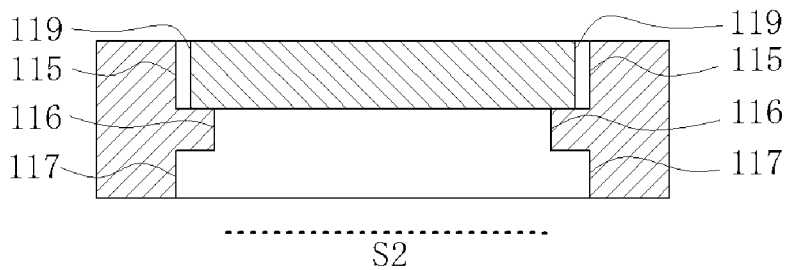
FIG. 5C is a schematic cross-sectional view taken along a line BII-BII in FIG. 4A for illustrating the method of manufacturing the light emitting device according to the first embodiment.

Thus, as shown in FIGS. 5B and 5C, the bonding surface of the bottom part 118 bonded to the frame part 111 has a size smaller than a size of a frame formed by an inner surface 115 (first inner surface) intersecting the bottom surface of the frame part 111, and is located inward of the frame formed by the inner surface 115. In other words, the inner surface 115 intersects the bonding surface 113 around a periphery of the bottom part 118 in a plan view, and an area within an intersection line between the inner surface 115 and the bonding surface 113 in the plan view having a size larger than a size of the arrangement surface of the bottom part 118. Further, the shapes of the inner surface 115 of the frame part 111 and a lateral surface 119 of the bottom part 118 are designed so that the arrangement surface of the bottom part 118 is bonded to the bonding surface 113 at the step portion of the frame part 111. The light emitting device 1 according to the first embodiment is designed so that the height from the bottom surface of the frame part 111 to the bonding surface 113 is the same as the height of the bottom part 118, and the periphery of the bottom part 118 is located inward of the frame formed by the inner surface 115 intersecting the bonding surface 113.

Further, a gap is generated between the inner surface 115 and the lateral surface 119. As described above, the frame part 111 can be formed of a ceramic, and the degree of sintering in manufacturing may not be constant. Thus, shapes and/or size of manufactured frame parts 111 may be varied. In manufacturing of the light emitting device 1, with consideration of design tolerance, the shapes of the frame part 111 and the bottom part 118 are designed so as to generate a gap of 0.1 mm between the frame part 111 and the bottom part 118. The shapes of the frame part 111 and the bottom part 118 may be designed such that a gap of 0.1 mm or more or a gap of 0.1 mm or less is present.

The size of the gap is preferably in a range of 0.1 mm to 0.5 mm. Accordingly, the bottom part 118 can be properly bonded to the bonding surface of the frame part 111, and the heat dissipation property of the bottom part 118 can be improved, so that the base member 110 excellent in heat dissipation property can be formed.

The size of the planar surface of the bottom part 118, which is bonded to the bonding surface 113, is larger than the size of a frame formed by the step portion. More specifically, the size of the planar surface of the bottom part 118, which is bonded to the bonding surface 113 of the frame part 111, is larger than the size of the frame formed by an inner surface 116 (second inner surface) intersecting an inner end of the bonding surface 113, and the frame formed by the inner surface 116 is covered with the bottom part 118. In other words, the inner surface 116 intersects the bonding surface 113 over the arrangement surface, and an area within an intersection line between the inner surface 116 and the bonding surface 113 in the plan view having a size smaller than the size of the arrangement surface.

In addition, the relationship between the frame formed by the inner surface 115 intersecting an inner end of the bottom surface of the frame part 111 and the frame formed by an inner surface 117 (second inner surface) intersecting an inner end of the upper surface of the frame part 111 is such that the width of the frame formed by the inner surface 115 is larger than the width of the frame formed by the inner surface 117 when seen in the S1 direction, and the widths of both frames are the same as each other when seen in the S2 direction. In the S1 direction, there is a side along which the step portion for the second electrode layer is not formed in top view, and the width of the frame at the lower surface side is larger than the width of the frame at the upper surface side for forming the bonding surface at the side corresponding to the side along which the step portion is not formed.

In the S2 direction, both sides are provided with the step portion for the second electrode layer, and therefore the bonding surface can be formed using a region corresponding to the step portion, so that the width of the frame at the lower surface side may not be larger than the width of the frame at the upper surface side.

Both sides of the frame part 111 when viewed in the S2 direction are provided with the first electrode layer on the bottom surface of the frame part 111. Both sides of the frame part 111 when viewed in the S1 direction are not provided with the first electrode layer on the bottom surface of the frame part 111.

In view of a heat dissipation performance, it is preferable that the bottom part 118 have a large size. Meanwhile, when the width of the bottom surface of the frame part 111 is reduced, at the time of performing soldering, solder may be brought into contact with or connected to both the first electrode layer and the bottom part 118. While the inner surfaces 115 and 117 are not required to have the same size as each other when viewed in the S2 direction, the inner surface 115 is located at a predetermined distance from the first electrode layer. The position of the inner end of the bottom surface of the frame part 111 is determined with a spacing of 0.3 mm or more from the first electrode layer having a width of 0.5 mm. The first electrode layer 112 is electrically connected to the second electrode layer 114 through a conductive portion provided inside the frame part 111.

An additional explanation will be given about determination of the structures of the frame part 111 and the bottom part 118. In view of a heat dissipation performance, a material having a good heat dissipation is desired to be used for the bottom part 118 so that heat is diffused from a position at which the semiconductor laser element 170, which is a main heat source, is arranged, so that a metal such as Cu is more preferably used for the bottom part 118 than a ceramic. In addition, the bottom part 118 is preferably large at a certain degree, and it is preferable that a portion exposed as an arrangement surface is made of metal. Further, for bonding the bottom surface 118 to the substrate 100, and effectively dissipating heat to the substrate 100 through the bonded portion, it is preferable that a material having poor heat dissipation is not disposed between the arrangement surface and the bonding surface bonded with the substrate 100.

In addition, in view of strength, and shape stability at the time of using the light emitting device 1, it is preferable that the outer frame of the base member is made of ceramic. Further, in order to provide a metal layer for electrically connecting the semiconductor laser element, it is necessary to form a step portion at a part of the ceramic frame. Accordingly, the base member 110 in the light emitting device 1 is required to include at least: a frame that surrounds the periphery; a bottom part on which a semiconductor laser is disposed; and a step portion for providing a metal layer.

The step portion in a top view is not required to be provided over the entire inner periphery of the frame part 111, and a region to be provided with the step can be appropriately adjusted according to the number of semiconductor laser elements 170 arranged in the light emitting device 1, or a combination in arrangement of a plurality of semiconductor laser elements 170. For example, the step portion is provided along one side or two sides of the frame part 111, or it may be necessary to provide the step portion over the entire periphery. The "combination in arrangement of a plurality of semiconductor laser elements 170" refers to, for example, a case where semiconductor laser elements having the same color and the same performance are disposed, or a case where semiconductor laser elements having different colors are disposed.

With consideration of these, a metal is used for the bottom part 118 while the frame part 111 is formed of a ceramic, so that interface between the frame part and the bottom part is formed for improving the heat dissipation. Further, a gap is provided with consideration of a design tolerance associated with a ceramic. Thus, it is possible to provide the base member 110 having good heat dissipation compared to a case where the arrangement surface of the base member 110 on which the semiconductor laser element 170 is disposed is formed of a ceramic.

Figure 6A:
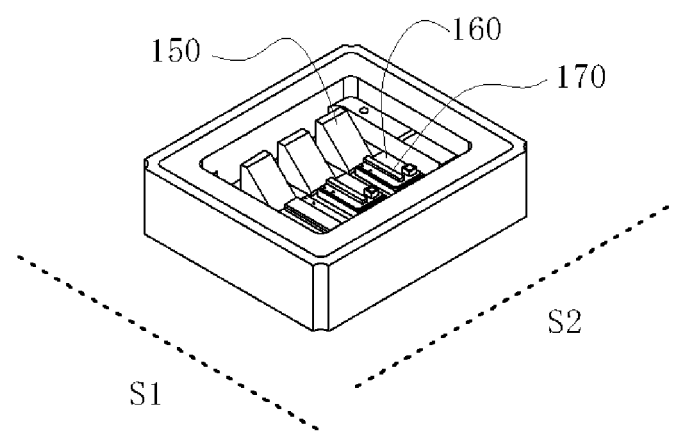
FIG. 6A is a schematic perspective view for illustrating the method of manufacturing the light emitting device according to the first embodiment.

In FIG. 6A, the light reflecting member 150, and the sub-mount 160 on which the semiconductor laser element 170 is arranged are bonded to the arrangement surface of the formed base member 110. The position at which the light reflecting member 150 and the sub-mount 160 are disposed is determined according to a position based on the frame part 111 rather than a position based on the bottom part 118. That is, the light reflecting member 150 and the sub-mount 160 are disposed according to, rather than a distance or a coordinate from a specific position on the bottom part 118, a distance or a coordinate from a predetermined position on the frame part 111.

A gap is generated between the frame part 111 and the bottom part 118 as described above, so that the bottom part 118 is movable in a frame formed by the frame part 111 before the bottom part 118 is fixed with the frame part 111. Therefore, the bottom part 118 may move at the time of performing bonding by brazing. For example, in the light emitting device 1, the shape of the frame of the frame part 111 is similar to the shape of the bonding surface of the bottom part 118, but as a result of performing bonding, the center points of the frame part 111 and the bottom part 118 may not correspond to each other, or the distance between the frame part 111 and the bottom part 118 may not be uniform. Therefore, it is preferable to adjust the arrangement position so that the position with respect to the frame part 111 is uniform for easily performing alignment between manufactured light emitting devices 1 even when the bottom part 118 is misaligned. The smaller the gap between the frame part 111 and the bottom part 118, the smaller the misalignment due to shifting.

The light reflecting member 150 has a light reflecting surface at one or more surfaces. The light reflecting member 150 is irradiated with light radiated from the semiconductor laser element 170, and therefore in the light reflecting member 150, it is desirable that a material resistant to heat be used as a main material, and a material having a high reflectivity be used for the light reflecting surface. Glass such as quartz or BK7 (borosilicate glass), a metal such as aluminum, Si or the like can be employed as a main material of the light reflecting member 150, and a metal, a dielectric multilayer film or the like can be employed for the light reflecting surface. If necessary, in the light emitting device 1, the light reflecting member 150 may have a plurality of light emitting surfaces, or a light reflecting member may be disposed in addition to the light reflecting member 150. Further, a respective one of light reflecting members 150 is provided for a respective one of semiconductor laser elements 170, but one light reflecting member 150 may be arranged for three semiconductor laser elements 170, or one light reflecting member 150 may be provided for a plurality of semiconductor laser elements.

For the sub-mount 160, aluminum nitride, or silicon carbide can be used. The sub-mount 160 is provided with a metal film, and the semiconductor laser element 170 is fixed to the sub-mount 160 via an electrically conductive layer of Au—Sn or the like.

The semiconductor laser element 170 is bonded to the sub-mount 160 at the bottom surface thereof, and radiates light from a lateral surface closer to the light reflecting member 150. Laser light radiated from the semiconductor laser element 170 has an elliptical far-field pattern (hereinafter, referred to as "FFP") having a length in a layering direction of a plurality of semiconductor layers including an active layer is larger than a length thereof in a direction perpendicular to the layering direction, on a surface parallel to a light emitting end surface.

The "FFP" as used herein refers to a light intensity distribution of radiated light measured on a surface apart from the light emitting end surface of the semiconductor laser element to a certain degree and parallel to the light emitting end surface. The shape of the FFP is specified as a shape given by a main part of light. Here, the main part of light from the laser element refers to a part of laser light with an intensity range of a peak intensity value to any appropriate lower intensity value such as $1/e^2$.

Figure 6B:
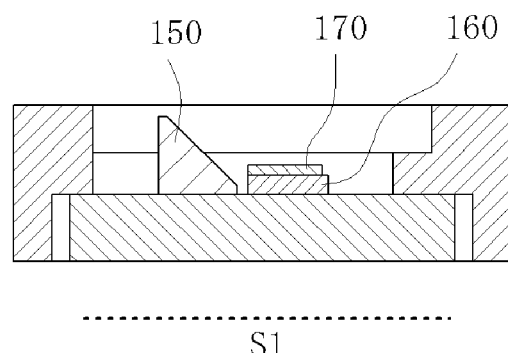
FIG. 6B is a schematic cross-sectional view taken along line BI-BI in FIG. 4A for illustrating the method of manufacturing the light emitting device according to the first embodiment.
Figure 6C:
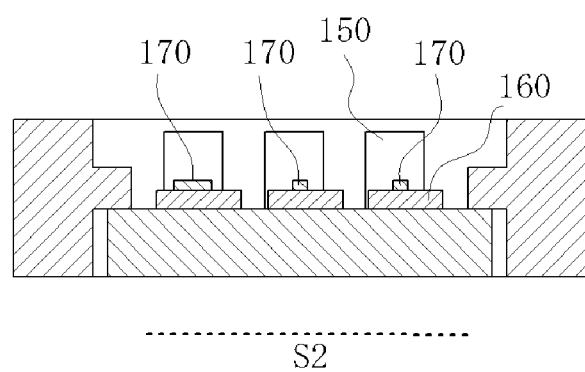
FIG. 6C is a schematic cross-sectional view taken along line BII-BII in FIG. 4A for illustrating the method of manufacturing the light emitting device according to the first embodiment.

The light emitting device 1 includes one or more semiconductor laser elements 170, and in FIGS. 6A to 6C, three semiconductor laser elements 170 are disposed. The number of the disposed semiconductor laser elements 170 is not limited to 3, and may be 1 or more. Light emitted from these semiconductor laser elements 170 may have the same color, or different colors. For example, the three semiconductor laser elements 170 of the light emitting device 1 may include a first semiconductor laser element which emits red light; a second semiconductor laser element which emits green light; a third semiconductor laser element which emits blue light.

The peak emission wavelength of red light is in a range of, for example, 605 nm to 750 nm. Examples of the semiconductor laser element which emits red light include those containing a semiconductor of InAlGaP type, GaInP type, GaAs type or AlGaAs type. The peak emission wavelength of green light is in a range of, for example, 495 nm to 570 nm. Examples of the semiconductor laser element which emits green light include semiconductor laser elements containing a nitride semiconductor.

The peak emission wavelength of blue light is in a range of, for example, 420 nm to 494 nm. Examples of the semiconductor laser element which emits blue light include semiconductor laser elements containing a nitride semiconductor. Examples of the nitride semiconductor include GaN, InGaN and AlGaN.

Figure 7A:
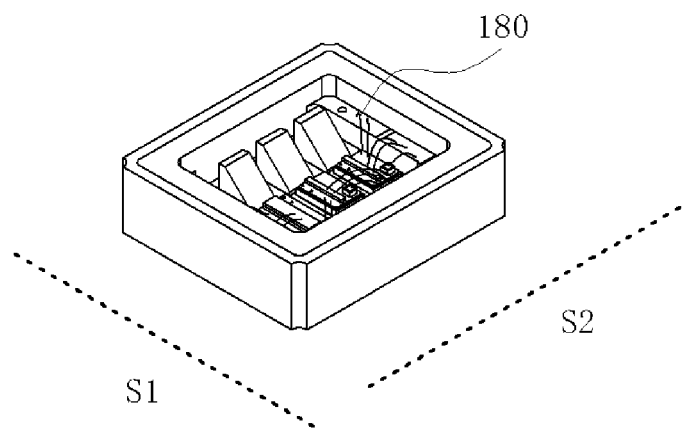
FIG. 7A is a schematic perspective view for illustrating the method of manufacturing the light emitting device according to the first embodiment.
Figure 7B:
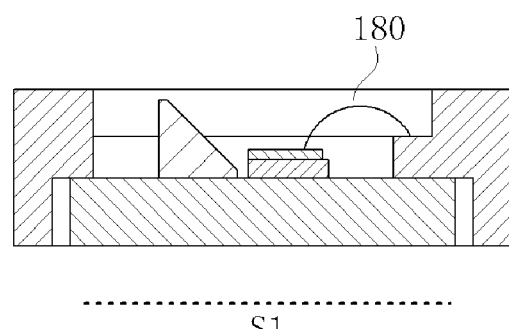
FIG. 7B is a schematic cross-sectional view taken along line BI-BI in FIG. 4A for illustrating the method of manufacturing the light emitting device according to the first embodiment.
Figure 7C:
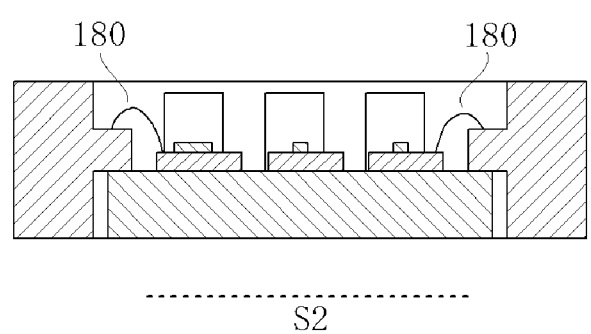
FIG. 7C is a schematic cross-sectional view taken along line BII-BII in FIG. 4A for illustrating the method of manufacturing the light emitting device according to the first embodiment.

In FIG. 7A, with wires bonded to the second electrode layer 114 in the frame part 111 and the semiconductor laser element 170, the second electrode layer 114 is electrically connect to the semiconductor laser element 170. For example, using a wire bonding device, one end of an Au wire is bonded to the semiconductor laser element 170, and the other end is bonded to the second electrode layer 114. When a protective element such as a Zener diode is arranged on the sub-mount 160, the protective element is also electrically connected by the wire 180.

As shown in FIGS. 6A and 6B, the step portion for providing the second electrode layer 114 is provided along three sides in top view, and is not provided along one side except for portions overlapping other sides.

The light reflecting member 150 is disposed between the one side along which the step portion is not formed and the semiconductor laser element 170 or the sub-mount 160, and the side along which the step portion is not formed is located at a side opposite to the semiconductor laser element 170 with the light reflecting member 150 disposed therebetween. Light radiated from the semiconductor laser element 170 is reflected by the light reflecting member 150 to travel upward. As can be understood from FIGS. 7A and 7B, if the side along which the step portion is not formed is provided with a step portion, and the second electrode layer 114 on the side is electrically connected to the semiconductor laser element 170 by the wire, the wire is present in a light traveling direction, and thus blocks the light. In view of this, a step portion for the second electrode layer 114 is not provided on a side at the light reflecting member 150 side, and thus the second electrode layer 114 can be appropriately disposed to allow reduction in the size of the light emitting device 1.

Figure 8A:
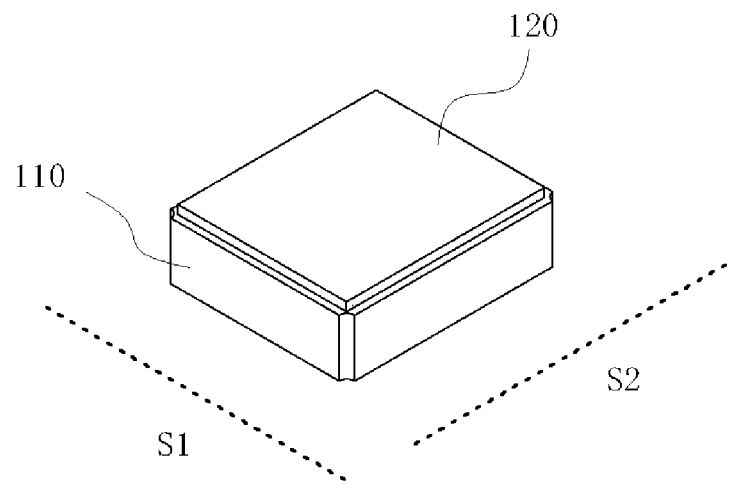
FIG. 8A is a schematic perspective view for illustrating the method of manufacturing the light emitting device according to the first embodiment.
Figure 8B:
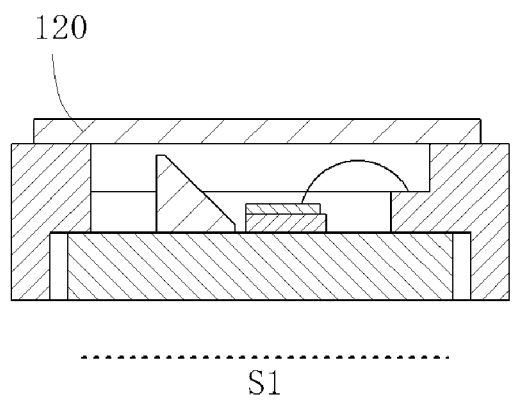
FIG. 8B is a sectional view on line BI-BI in FIG. 4A for illustrating the method of manufacturing the light emitting device according to the first embodiment.
Figure 8C:
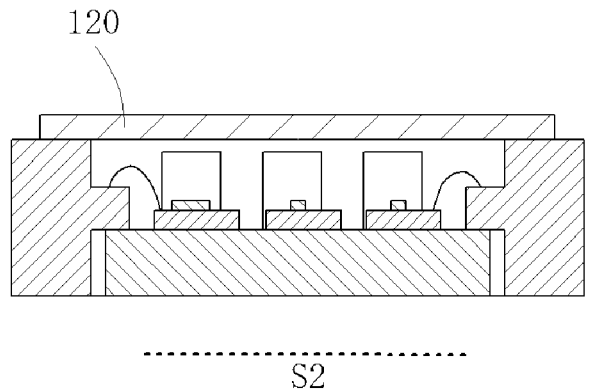
FIG. 8C is a schematic cross-sectional view taken along line BII-BII in FIG. 4A for illustrating the method of manufacturing the light emitting device according to the first embodiment.

In FIG. 8A, the frame part 111 of the base member 110 and the cover 120 are bonded together to hermetically seal a space in which the semiconductor laser elements 170 is arranged. For example, on the lower surface of the cover 120, a region bonded to the base member 110 is provided with a metal film, and the base member 110 is bonded and fixed to the cover 120 via AuSn or the like disposed therebetween. The semiconductor laser elements 170 are disposed in the closed space, so that collection of organic substances and the like on the light emitting end surface of the semiconductor laser element 170 can be reduced.

For the cover 120, for example, glass provided with a metal film or sapphire provided with a metal film can be used, and in particular, it is preferable to use sapphire provided with a metal film. While spread of light causes increase in size of a lens portion to transmit the light, using sapphire for the lens portion of the lens member 140 allows for reducing degree of spread of light because sapphire has a relatively high refractive index, so that the size of the lens portion of the lens member 140 can be reduced. Further, sapphire has relatively high strength, and is therefore hardly broken, so that hermetic reliability of a closed space can be secured.

Figure 9A:
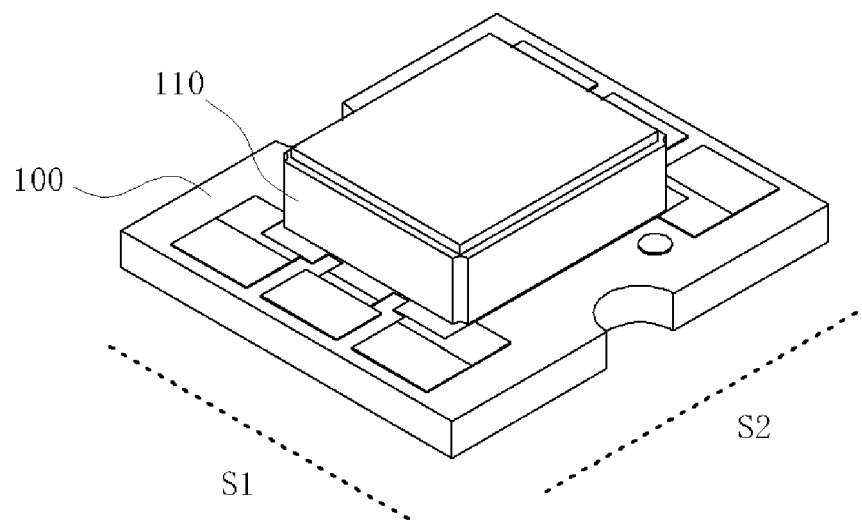
FIG. 9A is a schematic perspective view for illustrating the method of manufacturing the light emitting device according to the first embodiment.
Figure 9B:
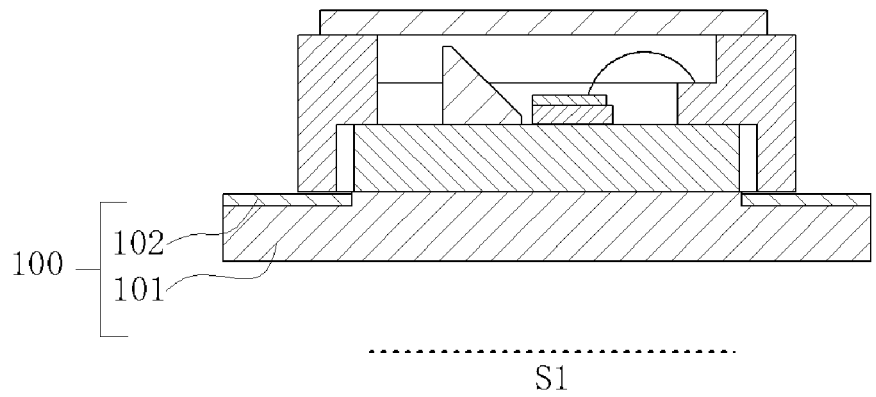
FIG. 9B is a schematic cross-sectional view taken along line BI-BI in FIG. 4A for illustrating the method of manufacturing the light emitting device according to the first embodiment.
Figure 9C:
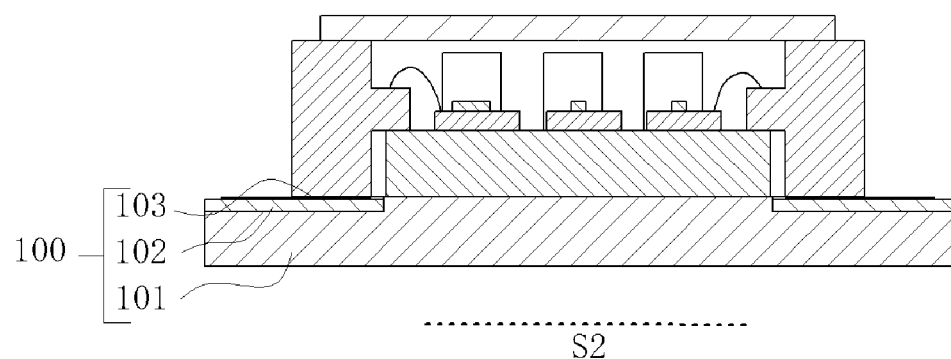
FIG. 9C is a schematic cross-sectional view taken along line BII-BII in FIG. 4A for illustrating the method of manufacturing the light emitting device according to the first embodiment.

In FIG. 9A, the base member 110 is mounted on the substrate 100. The substrate 100 is bonded to the bottom surface of the frame part 111 and the bottom part 118 of the base member 110. The bonding can be performed by soldering. As shown in FIGS. 9B and 9C, the substrate 100 includes a heat dissipation portion 101, an insulating portion 102 and the metal film 103. The heat dissipation portion 101 is formed of, for example, a metal such as Cu, the insulating portion 102 is formed of an insulating material, and the metal film 103 is formed of a metal such as Cu similarly to the heat dissipation portion 101.

The heat dissipation portion 101 is bonded to the bottom part 118 of the base member 110, and the metal film 103 or the insulating portion 102 is bonded to the frame part 111. Thus, the substrate 100 is designed such that the metal film 103 and the heat dissipation portion 101 are provided on the same plane. More specifically, the heat dissipation portion 101 has a protruded structure protruded toward the base member 110 in a cross-sectional view or a side view, and is formed so as to be exposed in a region bonded to the bottom part 118 of the base member 110. On the other hand, in a region where the substrate 100 is bonded to the frame part 111, the heat dissipation portion 101 does not protrude, and the heat dissipation portion 101 is not exposed by the insulating portion 102 disposed on the heat dissipation portion 101. In a bonding region of the substrate 100 that corresponds to a side of the frame part 111 provided with the first electrode layer 112, the metal film 103 is disposed on the insulating portion 102. Further, a predetermined spacing is provided between the heat dissipation portion 101 and the metal film 103 so that the heat dissipation portion 101 and the metal film 103 are not in contact with each other and electrically connected to each other. A part of the region provided with a predetermined spacing overlaps a part of the gap between the frame part 111 and the bottom part 118.

Figure 9D:
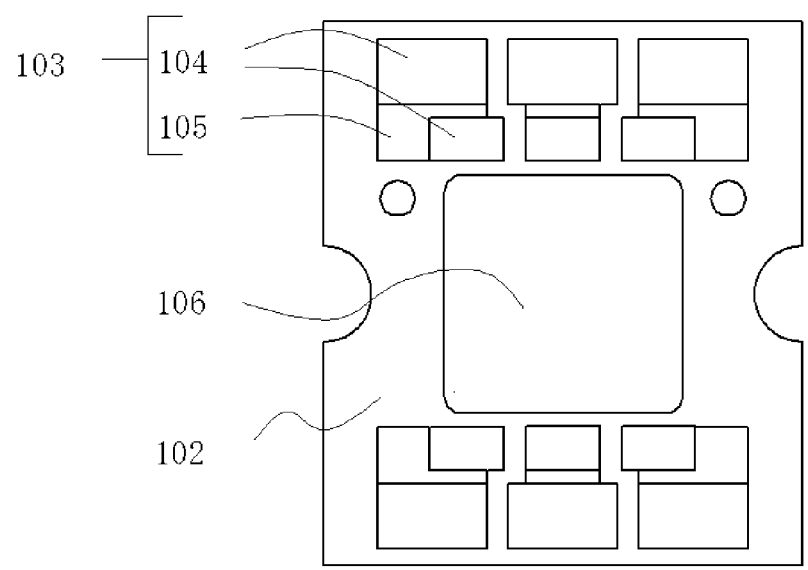
FIG. 9D is a schematic top view of a substrate of the light emitting device according to the first embodiment.

FIG. 9D is a top view of a bonding surface of the substrate 100 which is bonded to the base member 110. As shown in FIG. 9D, at the bonding surface of the substrate 100, the substrate 100 includes the insulating portion 102, the metal film 103, and an exposed portion 106 (a protruding section having an exposed surface) in which the heat dissipation portion 101 is disposed. Further, the metal film 103 includes metal regions 104 and an insulating region 105. The exposed portion 106 is bonded to the bottom part 118, and the metal regions 104 is bonded to the bottom surface of the frame part 111.

The shape of the exposed portion 106 represents a region where the heat dissipation portion 101 protrudes. In addition, the shape of the exposed portion 106 corresponds to the shape of the bottom surface of the bottom part 118, and is designed to have a size slightly larger than a size of the bottom surface of the bottom part 118. If the size of the exposed portion 106 is equal to the size of the bottom surface of the bottom part 118, solder cannot expand outward of the bonding surface when soldering, so that the solder may have an excessive thickness between the substrate 100 and the base member 110. Further, in a top view, each metal region 104 includes two portions located at both sides of the insulating region 105, Of the two portions of each metal region 104, a portion located closer to the center of the substrate 100 is bonded to the frame part 111. By the bonding, each of the metal region 104 is electrically connected to a corresponding first electrode layer 112.

With the metal films 103 and the exposed portion 106 of the heat dissipation portion 101 that are located at the same height, as described above, it is possible to reduce lifting of the frame part 111 or the bottom part 118 from the substrate 100 when bonding of the substrate 100 to the base member 110. If the degree of the lifting is increased, bonding strength may be reduced, or a non-bonded region may be partially formed, and therefore the possibility that detachment of the package from a mounting substrate occurs may be increased. Further, with the entirety of bottom surface of the bottom part 118 bonded to the exposed portion 106 of the heat dissipation portion 101, heat can be efficiently dissipated to the substrate 100.

Figure 10A:
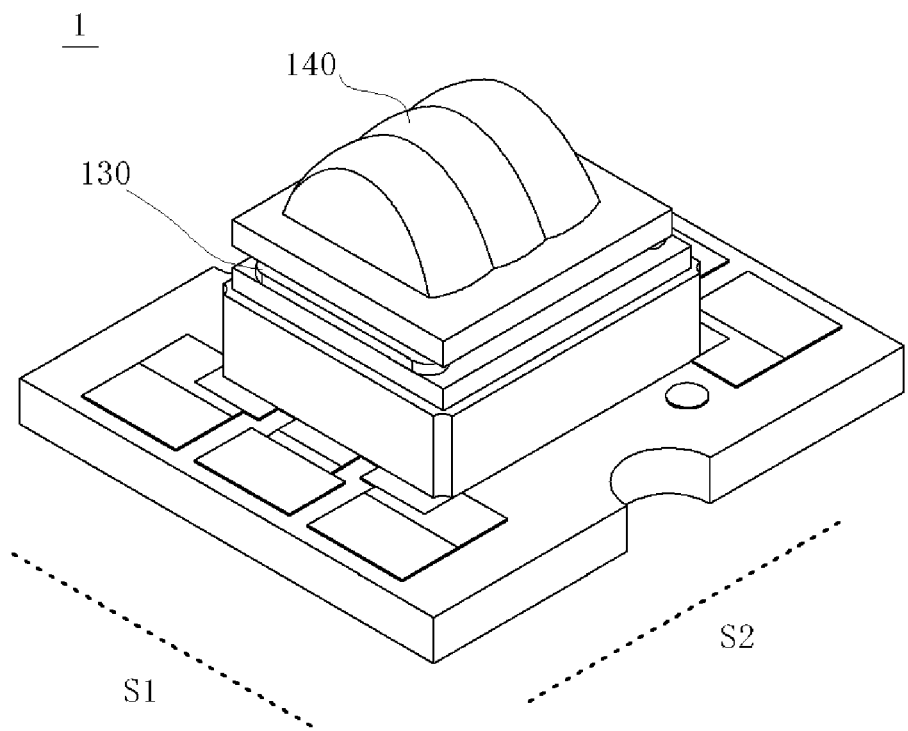
FIG. 10A is a schematic view for illustrating the method of manufacturing the light emitting device according to the first embodiment.

In FIG. 10A, the lens member 140 is fixed to the cover 120 using an adhesive agent. By the adhering, the adhesion portion 130 is formed between the cover 120 and the lens member 140, and the light emitting device 1 shown in FIGS. 1 to 3 is obtained. The adhesion portion 130 is not formed on the entire region of the upper surface of the cover 120 or the entire region of the lower surface of the lens member 140, and is provided at such a position where the adhesion portion 130 does not interrupt a path of light emitted from the semiconductor laser element 170. More specifically, in the light emitting device 1, a main part of light emitted by the semiconductor laser element 170 is incident on and emitted from a region of the lens member 140 which has a lens shape. Therefore, it is desirable to use the adhesive agent such that the adhesion portion 130 is not formed on the lower surface of the lens member 140 which corresponds to the region having a lens shape, and the adhesion portion 130 is formed in an outer peripheral region of the lens member 140. It is preferable that an ultraviolet ray-curable resin is used for an adhesive agent that forms the adhesion portion 130. An ultraviolet ray-curable resin can be cured in a relatively short time without heating the resin, so that the lens member 140 is easily fixed at a desired position.

Figure 10B:
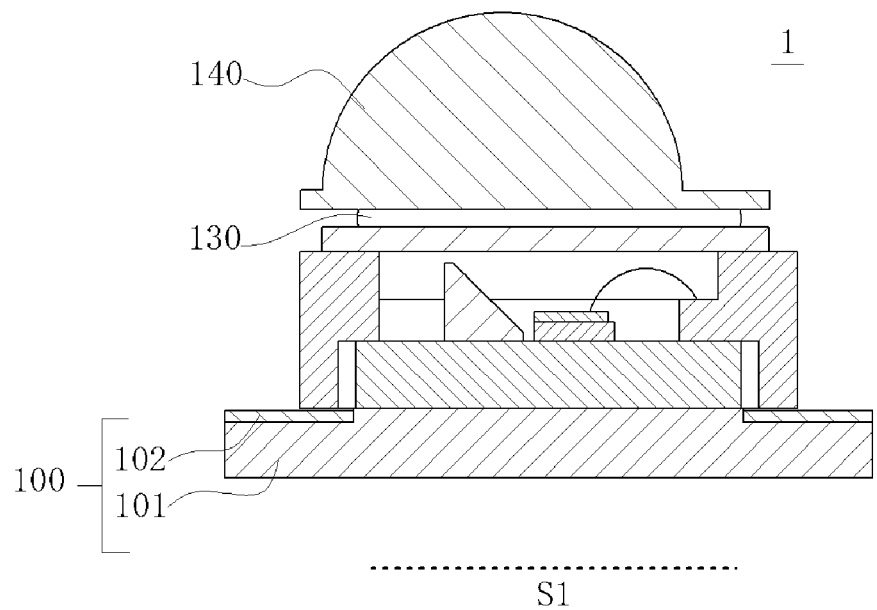
FIG. 10B is a schematic cross-sectional view taken along line BI-BI in FIG. 4A for illustrating the method of manufacturing the light emitting device according to the first embodiment.
Figure 10C:
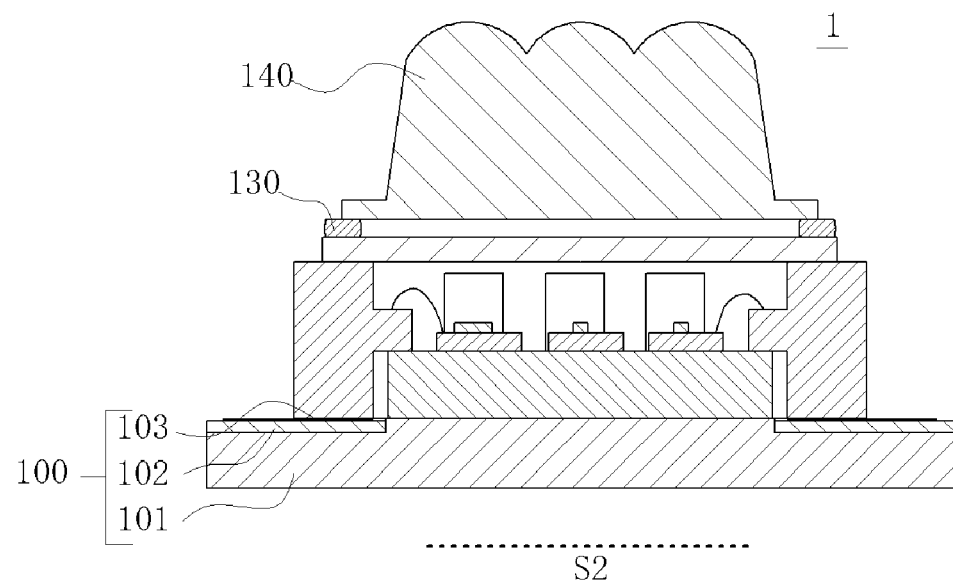
FIG. 10C is a schematic cross-sectional view taken along line BII-BII in FIG. 4A for illustrating the method of manufacturing the light emitting device according to the first embodiment.

As shown in FIGS. 10B and 10C, the lens member 140 has a lens shape in which a plurality of lens portions is connected. Further, the lens member 140 is designed such that one lens portion corresponds to one semiconductor laser element, and such that lens portions transmit main parts of light radiated from different semiconductor laser elements. For the lens member 140, for example, glass such as BK7 or B270 can be used.

The light emitting device 1 according to the first embodiment is manufactured in the manner described above. The steps for manufacturing the light emitting device 1 is not limited to the steps described above with reference to FIGS. 4A to 10A.

Second Embodiment

Figure 11:
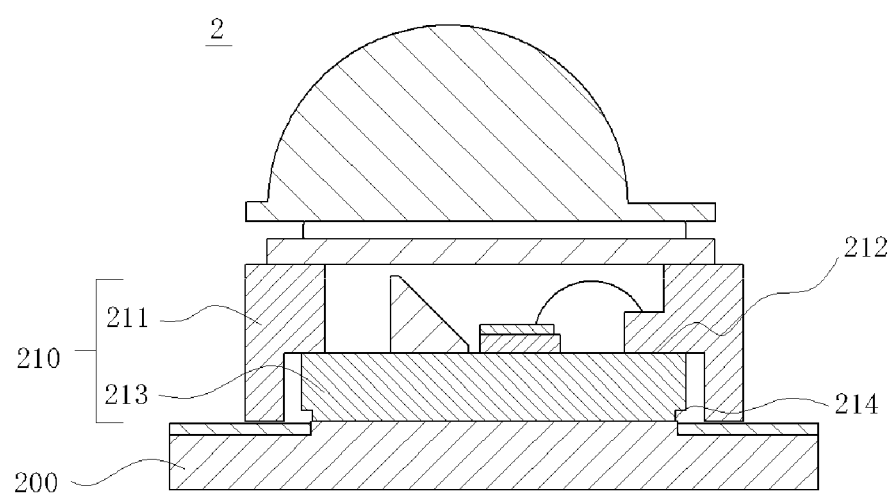
FIG. 11 is a schematic cross-sectional view of a light emitting device according to a second embodiment.

FIG. 11 is a sectional view of a light emitting device 2 according to a second embodiment. The schematic view of the appearance of the light emitting device 2 is not different from that in FIG. 1, and the internal structure of the light emitting device 2 in top view is not different from that in FIG. 2. The light emitting device 2 according to the second embodiment is different from the light emitting device 1 according to the first embodiment in the structure of a bottom part of a base member. In particular, in the second embodiment, the bonding surface of the bottom part, which is bonded to a substrate, is different from that in the first embodiment. Thus, with an insulating portion and an exposed portion on the bonding surface of the substrate that have shapes adapted to the bonding surface of the bottom part, structures, materials and the like as described in the first embodiment can be employed for other configurations.

As described in the step related to FIG. 5A for the light emitting device 1 of the first embodiment, it is desirable to dispose the bottom part 118 such that the distance between the frame part 111 and the bottom part 118 is entirely uniform at the time of bonding the frame part 111 to the bottom part 118. However, misalignment may occur in the process of bonding. If the degree of misalignment is great, a part of the bottom part 118 is brought into contact with the frame part 111. Further, if the spacing between the bottom part 118 and the frame part 111 is narrower than a designed spacing, and accordingly the distance between the first electrode layer 112 and the bottom part 118 at this part is reduced, then electrical connection may be established between the first electrode layer 112 and the bottom part 118 at the time of bonding the frame part 111 and the bottom part 118 to the substrate 100 by soldering, which may lead to defectiveness of a light emitting device.

Thus, in the light emitting device 2 according to the second embodiment, a depressed portion 214 is formed on at least the outer edge of a bonding surface 215 of a bottom part 213 bonded with a substrate 200. With this structure, the spacing between a frame part 211 and a bottom part 213 along a plane corresponding to the bottom surface, which is the bonding surface 215 bonded with the substrate 200, of a base member 210 is greater than the spacing between the frame part 211 and the bottom part 213 along a plane corresponding to a bonding surface 212 bonded with the frame part 211.

Figure 12A:
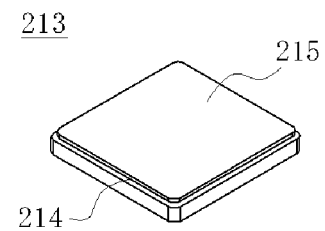
FIG. 12A is a schematic perspective view of a bottom part of the light emitting device according to the second embodiment.
Figure 12B:
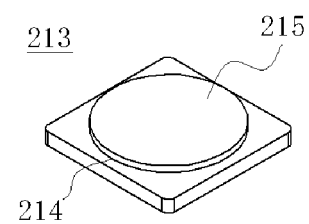
FIG. 12B is a schematic perspective view of the bottom part of the light emitting device according to the second embodiment.
Figure 13:
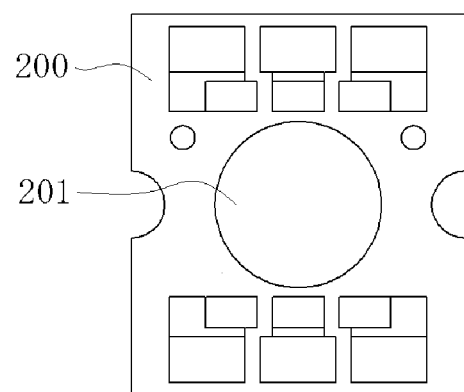
FIG. 13 is a schematic top view of a substrate of the light emitting device according to the second embodiment.

FIGS. 12A and 12B show an example of the bottom part 213 having the depressed portion 214. In one example, a protruded shape of the bottom part 213 forms a depression of the depressed portion 214. A protruding region having a protruded shape forms the bonding surface 215 bonded with the substrate 200, and the bonding surface 215 may have a shape obtained by scaling down a shape similar to the shape of an outer frame portion of the bottom part 213 as shown in FIG. 12A, or a circular shape as shown in FIG. 12B. FIG. 13 is a schematic view showing a bonding surface of the substrate 200 when the protruding region has a circular shape. As shown in FIG. 13, an exposed portion 201 has a circular shape in corresponding to the bonding surface 215 of the base member 210.

The depressed portion 214 has a spacing and height that sufficiently allows for preventing occurrence of the above-described defect in a step of soldering the base member to the substrate 200. For example, the light emitting device 1 of the first embodiment is designed such that a spacing of about 0.1 mm is provided in the light emitting device 1, and the depression may be designed so as to have a width of about 0.1 mm as long as a spacing of at least about 0.1 mm may be provided. Thus, even if the frame part 211 is in contact with a lateral surface of the bottom part 213 at the bonding surface 212 side bonded with the frame part 211, it is possible to maintain a spacing of about 0.1 mm between the frame part 211 and the bottom part 213 on the bonding surface bonded with the substrate 200. Further, for example, the light emitting device 1 of the first embodiment is designed such that the distance between the lateral surface 119 of the bottom part 118 and the first electrode layer 112 is 0.3 mm or more. When the width of the depression is designed, the width of the depression may be similarly selected with consideration of the design of the frame part so that a distance of approximately 0.3 mm from the first electrode layer 112 is maintained. The spacing of 0.3 mm is one example in design of the light emitting device 1, and a predetermined spacing to be provided may be appropriately selected according to the shape and materials of the light emitting device.

Therefore, the depressed portion 214 preferably has a width similar to a width of a gap that would be secured when the bottom part 213 does not have the depressed portion 214 and misalignment of the bottom part 213 with respect to the frame part 211 does not occur. The depressed portion 214 may have a width equal to or greater than a width of the gap, or may have such a shape that a part of the depression portion has a width equal to or greater than a width of the gap, as in the bottom part 213 in which the protruding region has a circular shape as shown in FIG. 12. However, because an increase in width of the depression leads to a decrease in bonding area with the substrate 200, it is desirable that the depressed portion 214 be prevented from having an excessively large width for attaining sufficient bonding, and the width of the depressed portion 214 is desirably 0.1 mm to 0.5 mm. For example, when a bonding surface has a circular shape as shown in FIG. 12, the depressed portion 214 may be designed such that the narrowest part of the depression has a width similar to that of a gap to be secured.

Further, the depressed portion 214 secures a height that allows a solder extended out from the bonding surface 215 of the bottom part 213 bonded with the substrate 200 to extend upward along a lateral surface meeting the bonding surface 215 bonded with the substrate 200, and to be retained in the depression. The height of the depressed portion 214 desirable to be secured is varied according to a material and an amount of solder to be used. For example, the depressed portion 214 secures a height of about 0.2 mm in the light emitting device 2.

When the bonding surface bonded with the substrate has a rectangular or square shape with four modified corners, as in the bottom part 118 described for the light emitting device 1 or the bottom part 213 shown as one example in FIG. 12, the exposed portion at the substrate side has a shape according to the shape of the bonding surface, and accordingly, self-alignment occurs at the time of bonding the bottom part to the substrate.

On the other hand, when the bonding surface 215 bonded with the substrate 200 has a circular shape as in the bottom part 213 shown in FIG. 12B as one example, the exposed portion 201 at the substrate side having a circular shape according to the shape of the bonding surface allows the bonding surface of the bottom part 213 to be located inward of the outer periphery of the exposed portion 201. Further, with the bonding surface 215 and the exposed portion 201 having such circular shapes, even in a state where the bonding surface 215 and the exposed portion 201 are bonded with each other via a solder, the substrate 200 and the bottom part 213 are movable along a rotating direction of the circular shape until the solder is solidified. With the bonding surface 215 bonded with the substrate 200 and having a circular shape, when misalignment occurs in arrangement of the frame part 211 and the bottom part 213, the arrangement can be adjusted in a rotating direction, so that misalignment of the frame part 211 with respect to the substrate 200 can be corrected.

First Modified Example

A light emitting device 3 according to a first modified example has a structure different from that in the light emitting device 2 shown in the second embodiment, so as to obtain a light emitting device in which the spacing between a frame part and a bottom part along a plane corresponding to a bonding surface bonded with a substrate is greater than the spacing between the frame part and the bottom part along a plane corresponding to a bonding surface bonded with the frame part.

Figure 14:
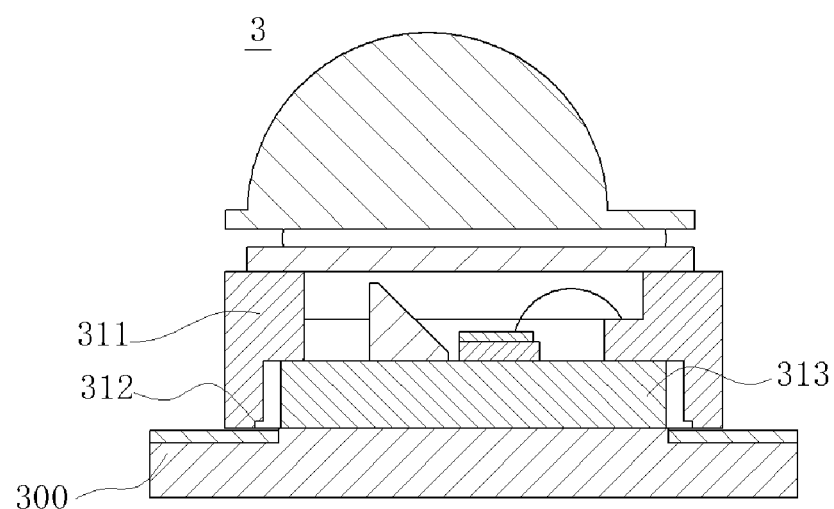
FIG. 14 is a schematic cross-sectional view of a light emitting device according to a first modified example.

FIG. 14 is a cross-sectional view of the light emitting device 3 according to the first modified example. As shown in FIG. 14, in the light emitting device 3, a depressed portion 312 is formed in a frame part 311, so that the spacing between the frame part 311 and a bottom part 313 along a plane corresponding to a bonding surface bonded with a substrate 300 is greater than the spacing between the frame part 311 and the bottom part 313 along a plane corresponding to a bonding surface bonded with the frame part 311. In other words, a size of the area within the intersection line between the inner surface of the frame part 311 and the bonding surface is smaller than a size of an area within an intersection line between the inner surface of the frame part 311 and the bottom surface of the frame part 311 in the plan view. The light emitting device 3 may be produced by a method including processing the shape of the frame part 311 as described above, and in the light emitting device 3, the substrate 100 in the first embodiment can be employed as such unlike the light emitting device 2.

Second Modified Example

Figure 15:
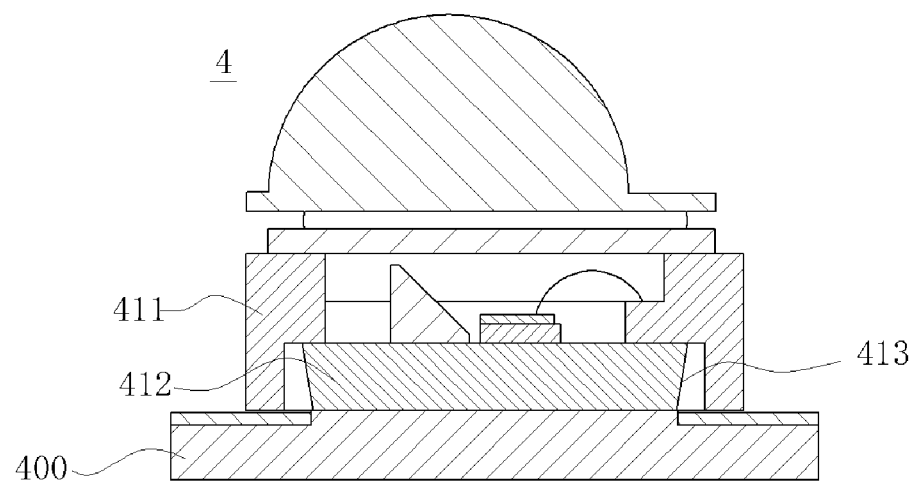
FIG. 15 is a schematic cross-sectional view of a light emitting device according to a second modified example.
Figure 16:
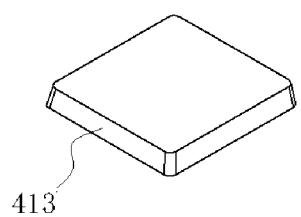
FIG. 16 is a schematic cross-schematic perspective view of a bottom part of the light emitting device according to the second modified example.

FIG. 15 is a cross-sectional view of a light emitting device 4 according to a second modified example. In addition, FIG. 16 is a schematic view of a bottom part according to the second modified example. As shown in FIG. 15, the light emitting device 4 includes a bottom part 412, in which a bonding surface bonded with a substrate 400 has a size smaller than a size of a bonding surface bonded with a frame part 411 at a bottom part 412, and a lateral surface 413 is inclined. With inclination of the lateral surface 413 as described above, the spacing between the frame part 411 and the bottom part 412 on the bonding surface bonded with the substrate 400 can be greater than the spacing between the frame part 411 and the bottom part 412 at the bonding surface bonded with the frame part 411. Instead of inclination of the bottom part 412, the frame part 411 may be provided with inclination as in the first modified example.

Certain embodiments and modified examples of the light emitting device according to the present invention has been described above, but the light emitting device for implementing the technical idea of the present invention is not limited to these embodiments and modified examples described above. For example, while a light emitting device in which three semiconductor laser elements are arranged has been described, one or more semiconductor laser elements may be arranged in the light emitting device. Also, the light emitting device may not include the light reflecting member 150 so that light radiated from a semiconductor laser element travels in a direction of the lens member 140.

In addition, the light emitting device having configurations described in the present disclosure is not limited to the structures of the light emitting devices 1 to 4. For example, the present invention can be applied even to a light emitting device having a constituent element which is not illustrated in descriptions of any of the light emitting devices 1 to 4, and having difference in a structure from a structure in the light emitting device as described above cannot be a ground for failure to apply the present invention.

On the other hand, the present invention can be applied without necessity of sufficiently including all constituent elements of the light emitting device described in the embodiments and modified examples above. For example, when some constituent elements of the light emitting device disclosed in the first embodiment are not described in claims, the constituent elements which are not described in claims may have any appropriate structure, and the freedom of design thereof such as replacement, omission, modification of the shape, change of materials, and the like by a person skilled in the art is accepted, with which application of the invention is claimed.

The light emitting device described in certain embodiments can be used for projectors, on-vehicle headlights, illuminations, backlights of display devices, and the like.

What is claimed is:

1. A light emitting device comprising:
a first semiconductor laser element configured to emit light;
a light reflecting member configured to reflect the light emitted from the first semiconductor laser element;
a base member including
a bottom part having an arrangement surface, and
a frame part bonded to the bottom part and forming a frame surrounding the arrangement surface, the frame part having
an upper surface,
a lower surface,
a step portion inside of the frame,
a bonding surface bonded to the bottom part,
a first inner surface extending below the bonding surface,
a second inner surface extending above the bonding surface,
a first planar surface defining a planar surface of the step portion on an upper surface side, and
a first electrode layer and a second electrode layer electrically connected to each other, the second electrode layer being disposed on the first planar surface of the frame part; and a wire bonded to the second electrode layer and electrically connected to the first semiconductor laser element, wherein a gap is present between a lateral surface of the bottom part and the first inner surface of the frame part, the first electrode layer is disposed on the lower surface of the frame part, and an area where the second electrode layer is disposed overlaps the bottom part in a top view.

2. The light emitting device according to claim 1, wherein in the top view, the first semiconductor laser element is disposed between the first planar surface and the light reflecting member.

3. The light emitting device according to claim 1, wherein the second inner surface has
- a region intersecting the bonding surface and the first planar surface, and
- a region intersecting the bonding surface, and not intersecting the first planar surface.

4. The light emitting device according to claim 1, wherein the bottom part contains a metal as a main material, and the frame part contains a ceramic as a main material.

5. The light emitting device according to claim 1, wherein the frame part has a quadrangular shape in a plan view, and the bottom part has a quadrangular shape in the plan view.

6. The light emitting device according to claim 1, wherein the bottom part has a heat dissipation higher than that of the frame part.

7. The light emitting device according to claim 1, wherein the bottom part has a thermal conductivity higher than that of the frame part.

8. The light emitting device according to claim 1, wherein the frame part has another first electrode layer and another second electrode layer electrically connected to each other, the another second electrode layer is disposed on the first planar surface of the frame part, and the another first electrode layer is disposed on the lower surface of the frame part.

9. The light emitting device according to claim 1, wherein the area where the second electrode layer is disposed does not overlap the first electrode layer in the top view.

10. A base member comprising:

a bottom part having an arrangement surface; and a frame part bonded to the bottom part and forming a frame surrounding the arrangement surface, wherein the frame part having
- an upper surface,
- a lower surface,
- a step portion inside of the frame,
- a bonding surface bonded to the bottom part,
- a first inner surface extending below the bonding surface,
- a second inner surface extending above the bonding surface,
- a first planar surface defining a planar surface of the step portion on an upper surface side, and
- a first electrode layer and a second electrode layer electrically connected to each other, the second electrode layer being disposed on the first planar surface of the frame part, a gap is present between a lateral surface of the bottom part and the first inner surface of the frame part, the first electrode layer is disposed on the lower surface of the frame part, and an area where the second electrode layer is disposed overlaps the bottom part in a top view.

11. The base member according to claim 10, wherein the second inner surface has
- a region intersecting the bonding surface and the first planar surface, and
- a region intersecting the bonding surface, and not intersecting the first planar surface.

12. The base member according to claim 10, wherein the bottom part contains a metal as a main material, and the frame part contains a ceramic as a main material.

13. The base member according to claim 10, wherein the bottom part has a heat dissipation higher than that of the frame part.

14. The base member according to claim 10, wherein the bottom part has a thermal conductivity higher than that of the frame part.

15. The base member according to claim 10, wherein the frame part has a quadrangular shape in a plan view, and the bottom part has a quadrangular shape in the plan view.

16. The base member according to claim 10, wherein the frame part has an another first electrode layer and an another second electrode layer electrically connected to each other, the another second electrode layer is disposed on the first planar surface of the frame part, and the another first electrode layer is disposed on the lower surface of the frame part.

17. The base member according to claim 10, wherein the area where the second electrode layer is disposed does not overlap the first electrode layer in a top view.

18. A base member comprising:

a bottom part having an arrangement surface; and a frame part bonded to the bottom part and forming a frame surrounding the arrangement surface, wherein the frame part having
- an upper surface,
- a lower surface,
- a step portion inside of the frame,
- a bonding surface bonded to the bottom part,
- a first inner surface extending below the bonding surface,
- a second inner surface extending above the bonding surface,
- a first planar surface defining a planar surface of the step portion on an upper surface side, and
- a first electrode layer and a second electrode layer electrically connected to each other, the second electrode layer being disposed on the first planar surface of the frame part, a gap is present between a lateral surface of the bottom part and the first inner surface of the frame part, and an area where the second electrode layer is disposed overlaps the bottom part in a top view.

* * * * *